US006703992B1

(12) United States Patent
Yamada

(10) Patent No.: US 6,703,992 B1
(45) Date of Patent: Mar. 9, 2004

(54) EL DISPLAY DEVICE WITH INTER-LINE INSULATION

(75) Inventor: Tsutomu Yamada, Gifu (JP)

(73) Assignee: Sanyo Electric Co., Ltd. (JP)

( * ) Notice: Subject to any disclaimer, the term of this patent is extended or adjusted under 35 U.S.C. 154(b) by 210 days.

(21) Appl. No.: 09/670,680

(22) Filed: Sep. 27, 2000

(30) Foreign Application Priority Data

Sep. 29, 1999 (JP) .......................................... 11-277104

(51) Int. Cl.[7] ................................................ G09G 3/30
(52) U.S. Cl. ............................ 345/76; 345/36; 345/45; 313/463; 313/518; 315/169.3
(58) Field of Search ............................. 345/76, 45, 50, 345/47, 36, 37, 38, 39, 40, 41, 87, 92; 313/463, 518; 315/169.3

(56) References Cited

U.S. PATENT DOCUMENTS 5,541,748 A  *  7/1996  Ono et al. ...................... 359/59
6,281,552 B1 *  8/2001  Kawasaki et al. .......... 257/350
6,335,773 B1 *  1/2002  Kamei et al. ................. 349/96
6,429,599 B1 *  8/2002  Yokoyama ............... 315/169.3

* cited by examiner

Primary Examiner—Matthew C. Bella
Assistant Examiner—Tam Tran
(74) Attorney, Agent, or Firm—Cantor Colburn LLP

(57) ABSTRACT

In an active matrix type EL device, a semiconductor layer (intersection protective film F1, F2, F3, F4) is inserted between lines at an intersection of a gate line GL and a data line DL; an intersection of the gate line GL and a power source line VL; an intersection of a storage capacitor line CL and the data line DL; and an intersection of the storage capacitor line CL and the power source line VL for inter-line insulation. No impurities are doped in the regions corresponding to these intersections CR1~CR4, to thereby maintain high resistance. The intersection protective films are integrally formed for the intersections CR1 and CR2 and for the intersections CR3 and CR4 and extend over the respective two intersections. With the above-described structure, it is possible to prevent short circuit or deterioration of voltage withstanding characteristics at the intersections on the panel where lines intersect, without a drastic increase in the number of processes.

6 Claims, 7 Drawing Sheets

EL DISPLAY DEVICE WITH INTER-LINE INSULATION

BACKGROUND OF THE INVENTION

1. Field of the Invention

The present invention relates to an electrolumnescence display device comprising electroluminescence elements and thin film transistors.

2. Description of Prior Art

In recent years, electroluminescence (referred to herein after as "EL") display devices comprising EL elements have gained attention as potential replacements for CRTs and LCDs. Research has been directed to the development of EL display devices using, for example, thin film transistors (referred to hereinafter as "TFT") as switching elements to drive the EL elements.

FIG. 1A is a plan view showing a display pixel of an organic EL display device. FIG. 1B shows a cross-sectional view taken along line A—A of FIG. 1A while FIG. 1C shows a cross-sectional view taken along line B—B of FIG. 1A.

As shown in these drawings, a display pixel 20 is formed in a region surrounded by a gate line GL and a data line DL. A first TFT serving as a switching element is disposed near an intersection of those lines. The source of the TFT 1 simultaneously functions as a second capacitor electrode 3 such that, together with a first capacitor electrode 2, it forms a capacitor 8. The source is connected to a gate electrode 15 of a second TFT 4 that drives the organic EL element. The source of the second TFT 4 contacts with an anode 6 of the organic EL element, while the drain of the TFT 4 is connected to a power source line (power source line) VL.

The first capacitor electrode 2, which is made of a material such as chromium, overlaps, over a gate insulating film 7, the second capacitor electrode 3 integral with the source of the first TFT 1. The first capacitor electrode 2 and the second capacitor electrode 3 together store charges with the gate insulating film 7 being interposed therebetween as a dielectric layer. The storage capacitors 8 serves to retain voltage applied to the gate electrodes 15 of the second TFT 4.

The first TFT 1, the switching TFT, will now be described.

First gate electrodes 11 made of refractory metal such as chromium (Cr) or molybdenum (Mo) are formed on a transparent insulator substrate 10 made of quartz glass, non-alkali glass, or a similar material. As shown in FIG. 1A, the first gate electrodes 11 are integrally formed with the gate line GL such that a plurality of these electrodes extend from the gate line GL in the vertical direction in parallel with each other.

Referring to FIG. 1B, the first capacitor electrode 2 formed in the same process as that of the first gate electrodes 11 is provided to the right side of the first gate electrodes 11. This first capacitor electrode 2, which constitutes the storage capacitor 8, has an enlarged portion between the first TFT 1 and the second TFT 4 as shown in FIG. 1A and is integral with a storage capacitor line CL extending therefrom in the directions.

A first active layer 12 composed of poly-silicon (referred to hereinafer as "p-Si") film is formed on the gate insulating film 7. The first active layer 12 is of a so-called LDD (Lightly Doped Drain) structure. Specifically, low-concentration regions are formed on both sides of the gate.

Source and drain regions, which are high-concentration regions, are further disposed on the outboard sides of the low-concentration regions. On the first active layer 12, a stopper insulating film 13 made of Si oxidation film is formed so as to prevent ions from entering the first active layer 12.

An interlayer insulating film 14 formed by sequential lamination of a $SiO_2$ film, a SiN film, and a $SiO_2$ film is provided on the entire surface over the gate insulating film 7, the active layer 12, and the stopper insulating film 13. The data line DL which functions as a drain electrode is electrically connected, through a contact hole C1 formed in the interlayer insulating film 14, to the drain in the active layer 12. A planarizing insulating film 18 made, for example, of an insulating organic resin is also formed over the entire surface for planarization.

In EL display devices which are driven by an electric current, the EL layers must have a uniform thickness.

Otherwise, current concentration may occur in a portion of the layer having thinner thickness. Thus, a significantly high level of planarity is required at least in portions where the EL elements are to be formed, and therefore the above-described planarizing film 18 made of a material having fluidity prior to hardening is employed.

The second TFT 4 which drives the organic EL element will be described with reference to FIGS. 1A and 1C.

On the insulating substrate 10, second gate electrodes 15 made of the same material as the first gate electrodes 11 are provided, and a second active layer 16 is further formed on the gate insulating film 7. Then, a stopper insulating film 17 is formed on the second active layer 16 in a manner similar to the above-mentioned stopper insulating film 13.

Intrinsic or substantially intrinsic channels are formed in the second active layer 16 above the gate electrodes 15, and source and drain regions are formed on respective sides of these channels by doping p-type impurities, thereby constituting a p-type channel TFT.

The above-described interlayer insulating film 14 is provided on the entire surface over the gate insulating film 7 and the second active layer 16, and the power source line VL is electrically connected, through a contact hole C2 formed in the interlayer insulating film 14, to the drain in the active layer 16. Further, the planarizing film 18 is formed over the entire surface, such that the source is exposed through a contact hole C3 formed in the planarizing film 18 and the interlayer insulating film 14. A transparent electrode made of ITO (Indium Tin Oxide) that contacts the source through this contact hole C3, namely, the anode 6 of the organic EL element 20, is formed on the planarizing insulating film 18.

The organic EL element 20 is formed by laminating, in order, the anode 6, an emissive element layer EM comprising a first hole transport layer 21, a second hole transport layer 22, an emissive layer 23 and an electron transport layer 24, and a cathode 25 made of a magnesium-indium alloy. The cathode 25 is substantially disposed over the entire surface of the organic EL elements.

The principle and operation for light emission of the organic EL element is as follows. Holes injected from the anode 6 and electrons injected from the cathode 25 recombine in the emissive layer 23, to thereby excite organic molecules constituting the emissive layer 23, thereby generating excitons. Through the process in which these excitons undergo radiation until deactivation, light is emitted from the emissive layer. This light radiates outward through the transparent anode via the transparent insulator substrate and resultant light emission is observed.

In this way, electric charge corresponding to the display data and applied via the source S of the first TFT 1 is accumulated in the storage capacitor 8 and applied to the gate electrodes 15 of the second TFT 4. According to this voltage, a current is applied to the organic EL element via the second TFT 4 and the organic EL element emits light by the light emitting principle as described above.

Active research of the above-described EL elements is expected continue, and EL display devices with a high yield rate are required. Further, to achieve high resolution, the size of a display pixel must be minimized so that a maximum number of display pixels can be efficiently fabricated into a display pixel region having a limited size.

In the current art, when a specific attention is drawn to one display pixel region as shown in FIG. 1A, a significant number of points where the conductive layers intersect are observed. Specifically, each display pixel includes four intersections, namely, an intersection between the gate line GL and the data line DL, an intersection between the gate line GL and the power source line VL, an intersection between the storage capacitor line CL and the data line DL, and an intersection between the storage capacitor line CL and the power source line VL. This results in the number of intersections corresponding to the number obtained by four times the number of display pixels for the whole panel.

In these intersections, however, short circuit or degradation of voltage withstanding characteristics tends to occur, thereby deteriorating display characteristics. In particular, when there is current leakage from the intersections with the power source line VL, brightness of the EL element decreases because the power source line VL serves as a power source line for supplying a current to the EL element.

SUMMARY OF THE INVENTION

The present invention was made in light of the above described disadvantages, and aims to provide a solution by providing a semiconductor layer at an intersection of and between a first line and a second line, which are disposed in a matrix so as to surround the display pixel.

The provided semiconductor layer is a film with relatively high resistance when the layer contains impurities of low concentration or contains substantially no impurities. Thus, when the semiconductor layer is interposed between the first and second lines disposed in a matrix, the voltage withstanding characteristics of both the first and the second lines can be enhanced. Further, since the semiconductor layer is temporarily formed between the first and second line layers, if the semiconductor layer is then removed by etching, the surface of the lines positioned above and under the semiconductor layer, especially the surface of the lower layer, is exposed to an etchant. This may result in characteristics deterioration such as increased line resistance due to formation of a oxidation film on the surface or short circuit. According to the present invention, however, the semiconductor layer is not removed by etching and remains between the layers, such that characteristics deterioration can be prevented.

The present invention is further characterized in that a semiconductor film constituting an active layer of a thin film transistor is provided at the intersection of the gate line and the power source line.

By providing a semiconductor layer formed in the same process as that of forming a semiconductor layer for a thin film transistor at the intersection of the gate line and the power source line VL, voltage withstanding characteristics of the gate line GL and the power source line VL can be enhanced.

The present invention is also characterized in that, in a structure in which the power source line and the data line extend so as to be adjacent to each other, a semiconductor film which constitutes an active layer of a thin film transistor is disposed at a first intersection between the data line and the gate line and in a second intersection between the power source line and the gate line, such that this semiconductor film integrally extends in a region between the first intersection and the second intersection and functions as a common interline insulating protective film.

When individual semiconductor films are provided for the first and the second intersections, the data line DL and the power source line VL must be spaced apart from each other so as to separate these semiconductor films. According to the present invention in which a semiconductor film is integrally formed so as to extend from the first intersection to the second intersection, such spacing is not required, thereby reducing the gap between these lines.

The present invention is further characterized in that, in an EL display device comprising a storage capacitor line which intersects the power source line and overlaps an upper layer electrode which extends from a second conductive region of the first thin film transistor to thereby form a storage capacitor, a semiconductor film constituting an active layer of a thin film transistor is inserted at an intersection between the storage capacitor line and the power source line.

By providing a semiconductor layer formed in the same process as that of a semiconductor, layer constituting a thin film transistor, especially at the intersection of the storage capacitor line CL and the power source line VL, voltage withstanding characteristics of the storage capacitor line CL and the power source line VL can be improved.

The present invention is also characterized in that, in a structure in which the power source line and the data line extend so as to be adjacent to each other, a semiconductor film is inserted at a third intersection between the data line and the storage capacitor line and at a fourth intersection between the power source line and the storage capacitor line, such that this semiconductor film integrally extends in a region between the third intersection and the fourth intersection and functions as a common interline insulating protective film.

When individual semiconductor films are provided for the third and the fourth intersections, the data line DL and the power source line VL must be spaced from each other so as to separate these semiconductor films. According to the present invention in which a semiconductor film is integrally formed so as to extend from the third intersection to the fourth intersection, such spacing is not required, thereby reducing the gap between the data line DL and the power source line VL.

The present invention is still further characterized in that an insulating layer is formed on the semiconductor films provided at these intersections so as to prevent ions from entering the semiconductor films.

It is thus possible to prevent short circuit or degradation of voltage withstanding characteristics in the above-described intersections to there by maintain display characteristics. Further, since the current applied to the power source line VL will not be decreased by current leaking at the intersections, the original brightness of the EL elements can be preserved.

BRIEF DESCRIPTION OF THE DRAWINGS

These and other objects of the present invention will be explained in the description below, in connection with the accompanying drawings, in which.

DETAILED DESCRIPTION OF THE PREFERRED EMBODIMENT

Figure 1A:
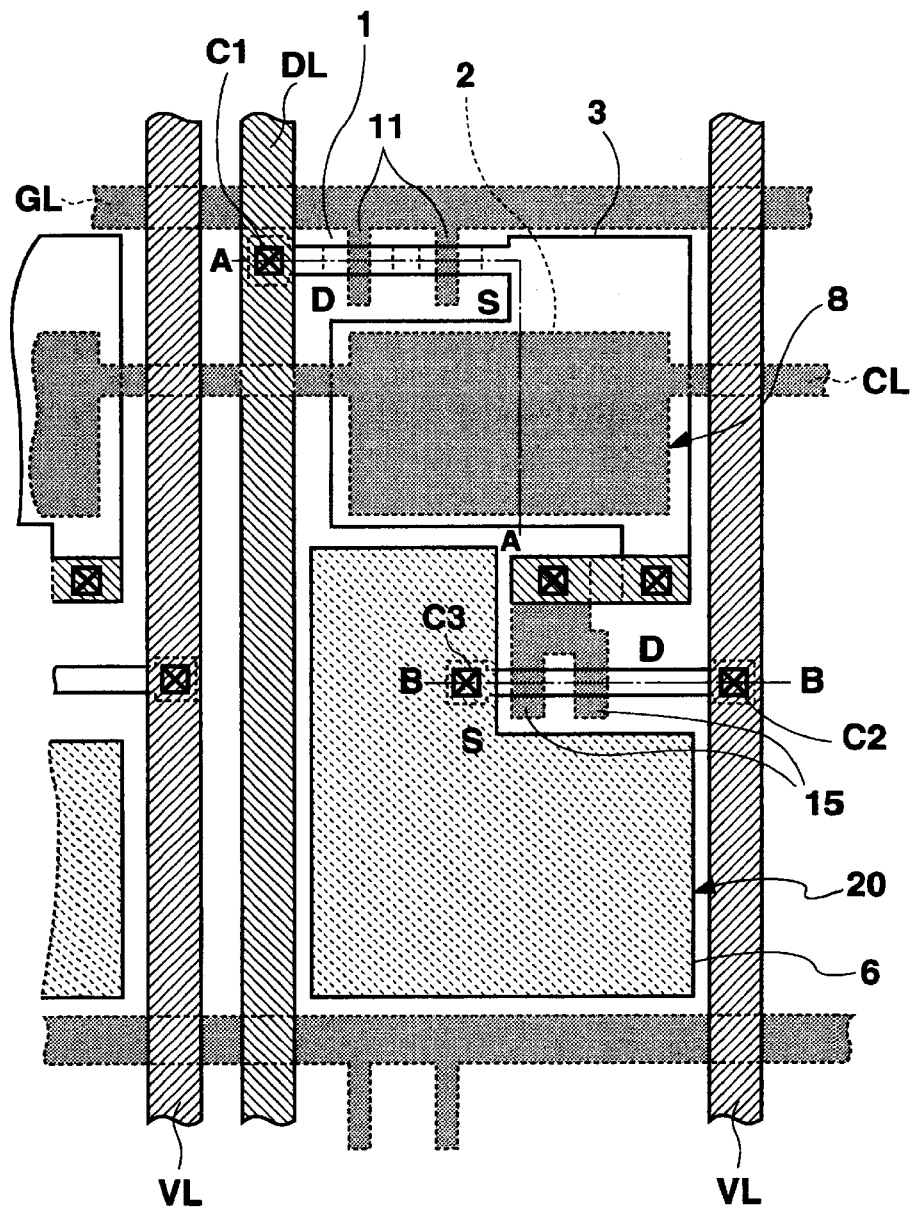
FIG. 1A is a plan view illustrating a display pixel of a prior art EL display device.
Figure 1B:
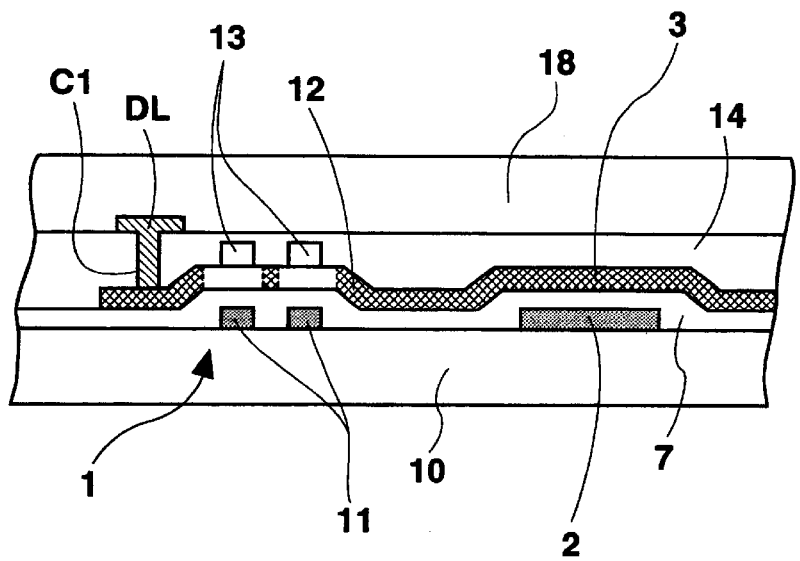
FIG. 1B is a cross-sectional view taken along line A—A of FIG. 1A.
Figure 1C:
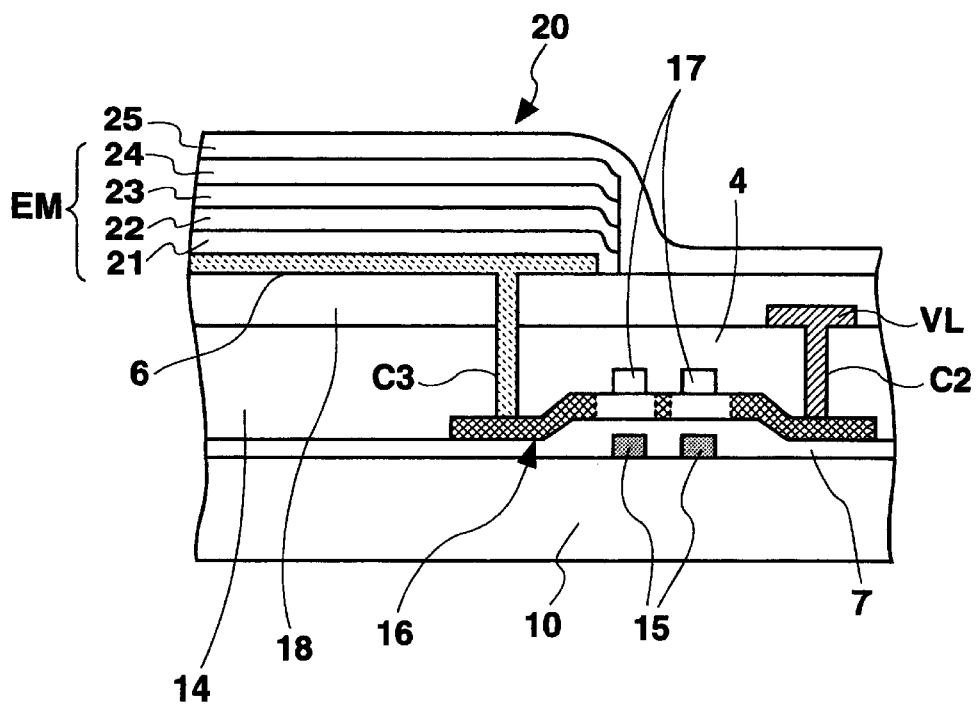
FIG. 1C is a cross-sectional view taken along line B—B of FIG. 1A.
Figure 2A:
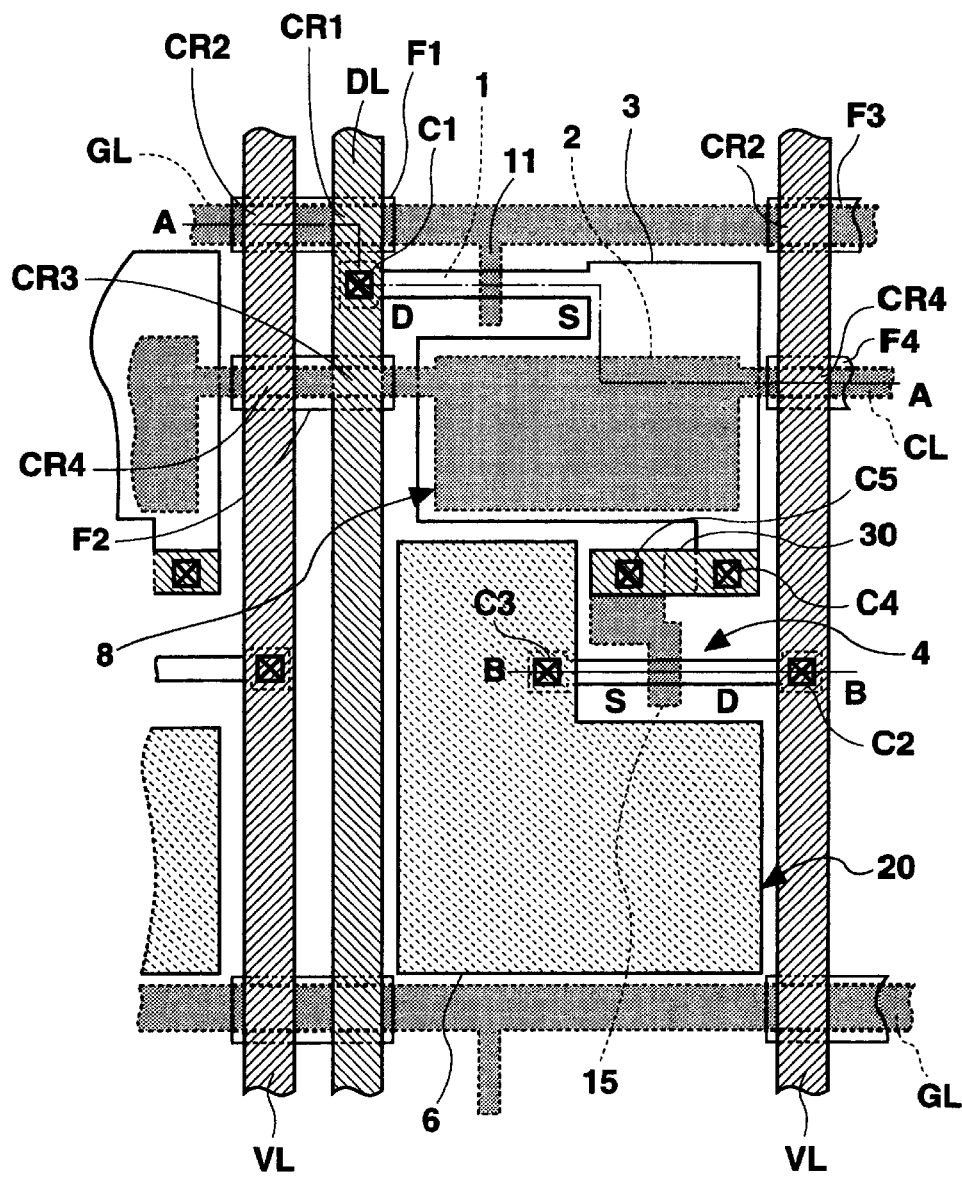
FIG. 2A is a plan view illustrating a display pixel of an EL display device according to an embodiment of the present invention.

The display device of the present invention will now be described. FIG. 2A is a plan view illustrating a display pixel of a bottom-gate type EL display device. In FIG. 2A, dotted regions enclosed by dotted lines indicate regions formed by a gate material, white regions enclosed by solid lines are Si layers (in this embodiment, a p-Si layer), and regions shaded by slant dots and enclosed by solid lines indicate portions comprising a transparent electrode. Finally, regions marked with diagonal lines and enclosed by solid lines indicate portions formed by an electrode made principally of Al.

Figure 2B:
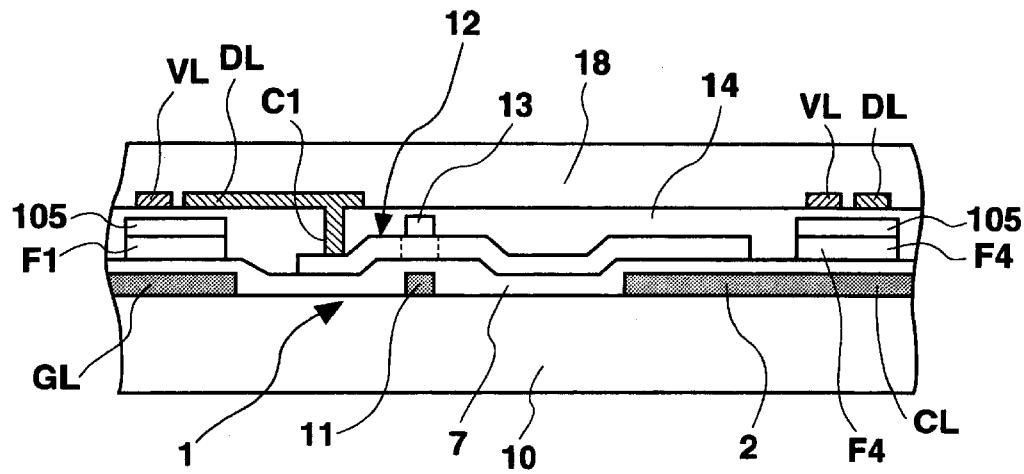
FIG. 2B is across-sectional view taken along line A—A of FIG. 2A.
Figure 2C:
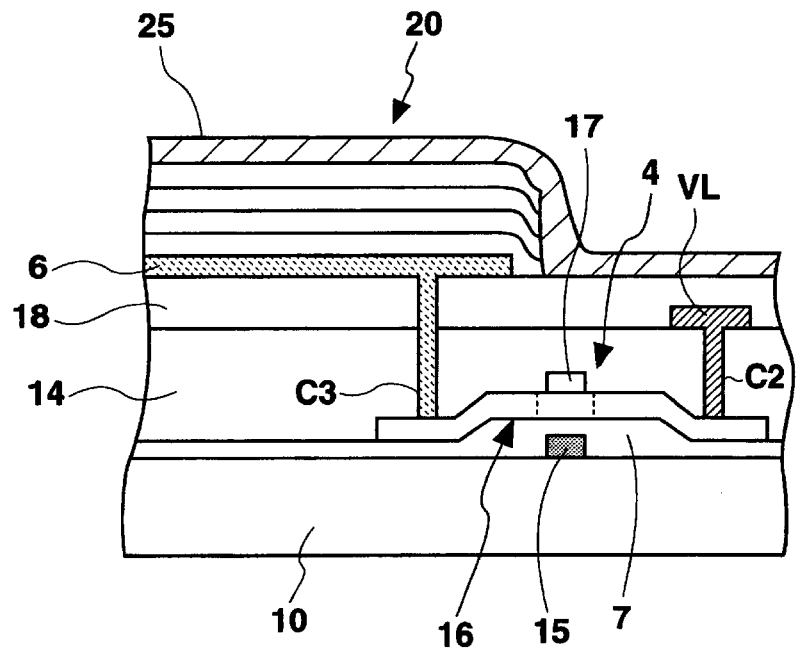
FIG. 2C is a cross-sectional view taken along line B—B of FIG. 2A.

FIGS. 2B and 2C are cross sectional views taken along lines A—A and B—B, respectively, of FIG. 2A. A plurality of display pixels are arranged in a matrix shape to constitute a display pixel region.

In the present embodiment, both of the first and second, TFTs 1 and 4 are of bottom-gate type, employ a Si film as the active layer, and include gate electrodes 11, 15 of a single-gate structure.

The organic EL display device will be next described in detail with reference to FIGS. 2A~2C.

A transparent substrate 10 which is insulating at least in the surface portion is provided. In the present embodiment, the substrate 10 is sealed with a metal cap (can), which is not shown, so as to protect the EL element from moisture. Due to the presence of this opaque metal cap, the substrate 10 through which emitted light radiates must be transparent. In this embodiment, a transparent substrate 10 made of glass, synthetic resin, or the like is employed.

On the transparent substrate 10, a plurality of gate lines GL extend in parallel with each other in the horizontal (row) direction along the upper side of one pixel region shown in FIG. 2A. A first capacitor electrode 2 which functions as a lower layer electrode of a storage capacitor 8 is also provided, with storage capacitor lines CL for connecting the storage capacitor electrodes 2 extending therefrom to the row direction. The lines GL, CL and the lines 30 which will be described later, are both formed in the same layer and are indicated in the drawings as dot-shaded regions. Because p-Si is employed in the upper layer, the lines GL and CL are made of a refractory metal such as Cr or Ta and, in the example of this embodiment, are formed by spattering Cr of approximately. 1000~2000 Å. In patterning, the sides are formed into a tapered shape considering step coverage.

Then, a gate insulating film 7 and an active layer (a first active layer 12 for the first TFT 1, or a second active layer 16 for the second TFT 4) are sequentially laminated on the entire surface. The active layers 12, 16, a second capacitor electrode 3 (the layer above the storage capacitor 8), and intersections protective films F1, F2, F3, F4, which are features of the present invention, are all formed by the same p-Si film. This p-Si film is obtained from an a-Si film formed by plasma CVD, using poly-crystallization annealing. A gate insulating film formed by lamination of an SiN film and an SiO2 film is provided under this p-Si film. More specifically, the gate insulating film has a layered structure in which, from the bottom, an Si nitride film of approximately 500 Å, an Si oxidation film of approximately 1300 Å, and an a-Si film of approximately 500 Å (which will be subjected to poly-crystallization) are sequentially laminated using continuous plasma CVD.

The a-Si film is subjected to dehydrogenation annealing under nitride atmosphere at approximately 400° C. and is subsequently poly-crystallized into a p-Si film using excimer laser. A stopper insulating film 13 and 17 made of Si oxidation film which functions as a mask during ion doping for the first and second active layers 12 and 16 is further provided. The stopper insulating film may be replaced with a resist mask, which is removed after ion doping. Although. either a stopper insulating film or a resist mask can be employed, in general, one is commonly used for both the first and second, TFTs.

For the first TFT 1, P (phosphorus) ions are doped in the source and drain to constitute an N-channel type TFT. For the second TFT 4, on the other hand, B (boron) ions are doped in the source and drain, to constitute a P-channel type TFT.

Further, the p-Si film is patterned in a desired shape using photolithography, as shown in FIG. 2A. Specifically, the p-Si layer of the first TFT 1 overlaps the data line DL near the intersection of the gate line GL and the data line (drain line) DL at the upper left of the figure and extends so as to traverse the gate electrode 11 while extending, as the second capacitor electrode 3, so as to overlap the first capacitor electrode 2. This second capacitor electrode 3 extends under the right end of a connection line 30 which is employed for -electrically connecting the second capacitor electrode 3 with the gate electrode 15 of the second TFT 4. The p-Si film of the second TFT 4, on the other hand, is formed under the drive line (power source line) VL at the right side and extends so as to traverse the second gate electrode 15. At the same time, this p-Si layer is disposed under the anode 6 constituting a transparent electrode.

The first intersection protective film F1 is provided at the first intersection CR1 of the data line DL and the gate line GL and at the second intersection CR2 between the gate line GL and the power source line VL provided in the adjacent display pixel at the left. The second intersection protective film F2 is provided at the third intersection CR3 of the data line DL, and the storage capacitor line CL and at the fourth intersection CR4 of the storage capacitor line, CL and the power source line VL provided in the adjacent display pixel at the left. The third intersection protective film F3 is provided to extend from the intersection (which corresponds to the first intersection CR1) of the data line DL formed in the adjacent display pixel at the right and the gate line GL to the intersection (which corresponds to the second intersection CR2) between the gate line GL and the power source line VL. The fourth intersection protective film F4 is provided to extend from the intersection (which corresponds to the third intersection CR3, but is not shown in the figure) of the data line DL formed in the adjacent display pixel at the right and the storage capacitor line CL to the intersection (which corresponds to the fourth intersection CR4) between the power source line VL and the storage capacitor line CL.

These intersection protective films may be disposed at respective intersections. Alternatively, when the data line DL and the power source line VL are adjacent to each other as shown in FIG. 2A, the intersection protective films may be integrated to extend from the first intersection CR1 to the second intersection CR2, or from the third intersection CR3 to the fourth intersection CR4.

When individual intersection protective films are provided, for example, at the first intersection CR1 of the data line DL and the gate line GL and at the second intersection CR2 of the power source line VL and the gate line GL, respectively, a gap between the data line DL and the power source line VL must be increased so as to separate these two intersection protective films. However, by providing the intersection protective film F1 which is formed by integrating these two films as shown in FIG. 2A, the gap between the data line DL and the power source line VL can be decreased.

An interlayer insulating film 14 is formed over the TFTs. The interlayer insulating film 14 is of a three-layered structure in which, from bottom, an Si oxidation film of approximately 1000 Å, an Si nitride film of approximately 3000 Å, and an Si oxidation film of approximately 1000 Å are sequentially laminated, and is formed using continuous CVD. However, the interlayer insulating film 14 may comprise at least one layer and the film thickness is not limited to the above-described example.

On the interlayer insulating film 14, are formed the data line DL, the power source line VL, and the connection line 30 indicated as regions shaded with diagonal lines in FIG. 2A. In the portions of the interlayer insulating film 14 corresponding to a contact hole C1 formed through the data line DL to the active layer of the first TFT 1, a contact hole C2 formed through the power source line VL to the active layer of the second TFT 4, and a contact hole C4 between the connection line 30 and the second capacitor electrode 3, openings are formed so that the semiconductor layer provided in the lower layer is exposed. These contact holes are filled with a connection material. In a contact hole C5 formed between the connection line 30 and the second gate electrode 15, unlike other contact holes, the gate insulating film 7 as well as the insulating film 14 is formed between the layers and therefore the gate insulating film 7 is also etched to expose Cr. These lines DL and VL have a laminated structure of the lower Mo layer of 1000 Å and the upper Al layer of 7000 Å. The Mo layer is a barrier layer.

A planarizing film 18 made of an insulating material of approximately 1–3 $\mu$m is further formed on the entire surface over the above-described lines and the interlayer insulating film 14. This planarizing film 18 is employed to accommodate the emissive element films of the organic EL element to be formed above the planarizing film 18. Namely, the emissive element films containing an organic EL material are very thin films having a laminated structure in which, in the present embodiment, a first hole transport layer 21, a second hole transport layer 22, an emissive layer 23, and an electron transport layer 24 are sequentially laminated. Alternatively, the emissive element film may comprise one hole transport layer. This EL element is driven by an electrical current. Accordingly, unless the films have an extremely uniform thickness, a significant amount of current flows in thinner film portions, where luminance points with extremely strong light emission are generated. These luminance points tend to experience degradation of the organic films, which, in the worst case, leads to a breakdown. To avoid such breakdown, the entire surface including the anode 6 must be as flat as possible. In this embodiment, acrylic liquid resin which becomes flat before hardening due to its fluidity is applied on the surface. However, the planarizing film 18 is not limited to this example as long as the surface is planarized.

In the portion where the anode 6 and the source of the second TFT 4 are connected, the planarizing film 18 and the interlayer insulating film 14 has an opening which serves as a contact hole 3 which exposes the second active layer 16.

Further, the organic films which constitute the EL element are provided at least on the anode 6. Specifically, on the anode 6, an emissive element layer EM including a first hole transport layer 21 comprising MTDATA(4,4',4"-tris(3-methylphenylphenylamino)triphenylamine), a second hole transport layer 22 comprising TPD (N,N'-diphenyl-N,N'-di (3-methylphenyl)-1,1'-biphenyl-4,4'-diamine), an emissive layer 23 comprising quinacridon derivatives and $Bebq_2$(bis (10-hydroxybenzo[h]quinolinato)beryllium), and an electron transport layer 24 comprising $Bebq_2$, and a cathode 25 comprising magnesium silver(Ag)-indium alloy, Al—Li alloy, or Al/LiF or the like are sequentially laminated. The cathode 25 has a laminated structure of Al and LiF (in which LiF is very thin to substantially form an alloy).

While the anode 6 must be patterned for each pixel, the films above the anode 6 may be formed in either one of the following structures: (1) the organic films on the anode 6 are patterned for each pixel and the cathode 25 is formed unpatterned on substantially the entire surface over the display region as in FIG. 2C; or (2) for monochrome display, only the anode 6 is patterned for each pixel as in FIG. 2A and the remaining films above the anode 6 are formed unpatterned.

The cathode 25, which need not be patterned, is generally formed unpatterned over the entire surface. Further, as shown in FIG. 2C, the side face and the area near the edge of the anode 6 are completely covered with the organic films of the EL element, to thereby prevent the possibility of short circuit between the anode 6 and the cathode 25. Another insulating film may be formed over the planarizing film 18 so as to cover the edges of the anode 6.

A metal cap (can) is attached to the substrate 10 so as to cover the EL layers formed in the display region or all the EL layers to protect the EL layers from deteriorating due to exposure to water or water vapor. Accordingly, any film with anti-moisture characteristics which will not deteriorate the EL layers, such as a resin film, may be employed in place of, or in combination with, a metal cap.

The principle and operation for light emission of the organic EL element will next be explained. Holes injected from the anode 6 and electrons injected from the cathode 25 recombine in the emissive layer 25, to thereby excite organic molecules constituting the emissive layer, thereby generating excitons. Through the process in which these excitons undergo radiation until deactivation, light is emitted from the emissive layer. This light radiates outward through the transparent anode via the transparent insulator substrate, resulting in light emission.

The present invention is characterized by the inclusion of the intersection protective films F1, F2, F3, F4. Since the aforementioned intersections CR1~CR4 are formed for each of the display pixels arranged in a matrix in the display pixel region, a significant number, equal to four times the number of display pixels, of such intersections are provided. At these intersections, short circuit or degradation of voltage withstanding characteristics may occur due to the film material of the gate insulating film 7 and the interlayer insulating film 14 disposed at these intersections, or due to contamination.

By providing a semiconductor layer, which is commonly used for the active layer of the TFT, at these intersections, it is possible to prevent such short circuit or degradation of voltage withstanding characteristics, without employing any extra manufacturing processes, because the semiconductor layer serves as an insulating film.

In particular, a semiconductor film containing no impurities has high resistance and is therefore suitable for a material to be inserted at the intersections CR1~CR4. A method of forming such a semiconductor film containing no impurities will be described in the following description for a manufacturing method of an EL display device.

Figure 3A:
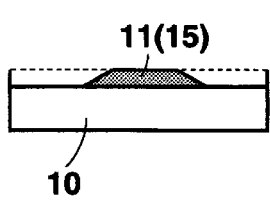
FIGS. 3A(a), 3A(b), 3B(a), 3B(b), 3C(a), 3C(b), 3D(a), 3D(b), 3E(a), 3E(b), 3F(a), 3F(b), 3G(a), 3G(b), 3H(a), 3H(b), 3I(a), and 3I(b) are views for explaining manufacturing processes of the EL display device of FIG. 2A.
Figure 3A:
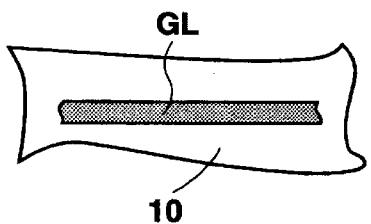

FIGS. 3A(a)~3I(b) illustrate a method of manufacturing an EL display device. The cross sectional views at the left side depict a manufacturing method of the first TFT 1 or the second TFT 4, with the first TFT 1 being depicted in the drawings. The drawings at the right side depict, in plan views, the intersections CR1, CR2 of the gate line GL, the power source line VL, and the data line DL in accordance with the manufacturing processes of the TFT.

Referring to FIGS. 3A(a) and (b), the first gate electrode 11 (the second gate electrode 15) is first formed on the transparent substrate 10. Simultaneously, the gate line GL, which is integral with the first gate electrode 11, is provided. In the present embodiment, Cr is employed as a gate material, as previously described.

Figure 3B:
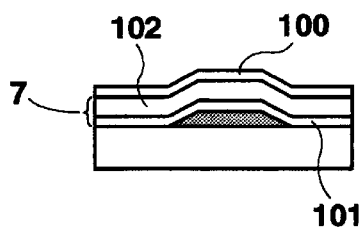
Figure 3B:
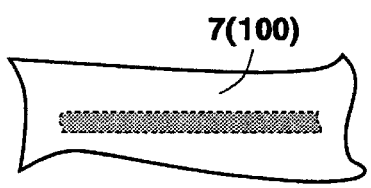

Referring to FIGS. 3B(a) and (b), the gate insulating film 7 and the a-Si film 100 is provided over the entire surface. The gate insulating film 7 is formed by sequential lamination, from the bottom, of Si nitride film 101 and Si oxidation film 102.

Figure 3C:
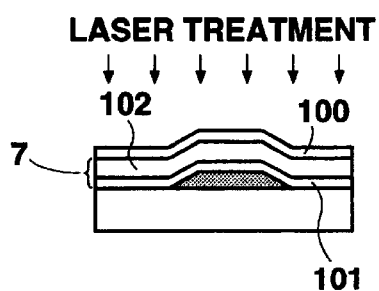
Figure 3C:
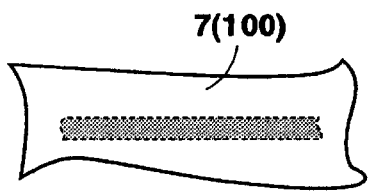

Referring to FIG. 3C(a) and (b), the a-Si film 100, after treated by dehydrogenation, annealing, is subjected to excimer laser treatment to form a p-Si film.

In order to form the stopper insulating film, the entire surface, after being covered with an Si oxidation film 103, is then provided with a photoresist patterned using back exposure The photoresist is patterned in a form identical to that of the gate line GL, and the Si oxidation film is patterned using this photoresist as a protective film. As a result, an Si oxidation film 13 which has been patterned in the same form as the gate electrode and the gate line GL is obtained.

Figure 3D:
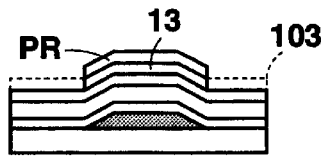
Figure 3D:
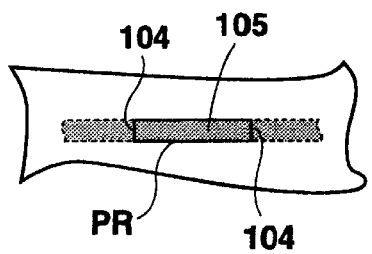

After removing the photoresist, a photoresist PR is applied once again and patterned in substantially the same form as the Si oxidation film 13, as shown in FIG. 3D(a). In FIG. 3D(a), the photoresist PR is removed at region where the source and drain of the TFT will be formed and the semiconductor film 100 is exposed in that region, because, in this region, impurities must be doped in the source and drain. Referring to FIG. 3D(b), the photoresist PR is remained by patterning the Si oxidation film 103 in a predetermined section (between edges 104—104) of the intersection. The Si oxidation film 103 is then patterned using this photoresist PR such that the linear-shaped stopper insulating film 105 remains on the gate line GL. The section between the edges 104—104, where the Si oxidation film 103 as the stopper 105 remains, is determined to have a width somewhat larger than the width including those of the data line DL and the drive VL. By the processes described hitherto, the stopper insulating film 13 is formed on the region where the TFT channel will be formed as shown in FIG. 3D(a), while the stopper insulating film 105 is selectively formed in the line intersection, as shown in FIG. 3D(b). By providing the stopper insulating film 105 along with the semiconductor film 100 in the intersections, it is possible to enhance the ability to withstand voltages and to prevent short circuit.

Figure 3E:
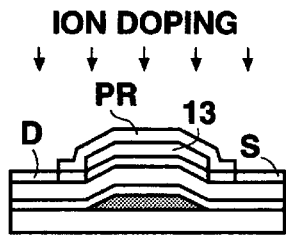
Figure 3E:
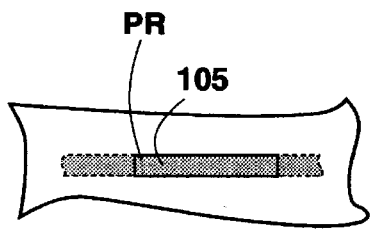

Ion doping is then performed for the semiconductor film 100, as shown in FIGS. 3E(a) and (b). Since an LDD structure is employed for the first TFT 1 in the present embodiment, ion doping using phosphorus (P) ions of low concentration is performed while leaving the photoresist PR formed on the stopper insulating films 13 and 105 in the aforementioned processes unremoved. After the second TFT 4 (P-channel type TFT) and the channel and LDD region of the first TFT are provided with a mask, phosphorus (P) ions are doped into the first TFT 1 to form high concentration N type source and drain regions. Once the first TFT 1 (N-channel type TFT) is provided with a mask, boron (B) ions are doped into the second TFT 4 to form P type source and drain regions.

Accordingly, in FIG. 3E(a), ions are doped in the regions of the first and second TFTs 1 and 4 corresponding to respective sources and drains. Referring to FIG. 3E(b), ions are not doped in the region directly under the stopper insulating film 105. In the present embodiment, no impurities are doped in the stopper insulating film 105 which, in a case of an N-channel, is covered with the photoresist during the ion doping process. Therefore, voltage withstanding characteristics in the intersections can be further enhanced.

Figure 3F:
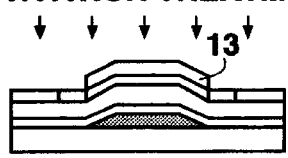
Figure 3F:
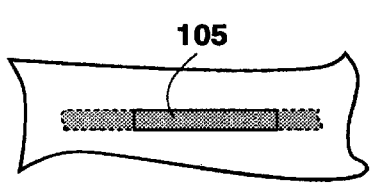

Subsequently, heat treatment is applied to perform an activation treatment for impurity diffusion, as shown in FIGS. 3F(a) and (b).

Then, a photoresist is further applied, so that, in FIG. 3F(a), the photoresist remains (not shown) on the active region including the source and drain of the thin film transistors 1 and 4 while, in FIG. 3F(b), the photoresist remains to have the same lateral width (the length in the horizontal direction of the figure) as that of the stopper insulating film 105 and the length in the vertical direction which is slightly larger than that of the stopper insulating film 105.

The p-Si film applied on the entire surface via this photoresist is etched and patterned so as to leave the active region in FIG. 3F(a) while the intersection protective films F1, F2, F3, F3 made of p-Si are formed in FIG. 3F(b). Although not shown in the drawings, the second capacitor electrode 3 is also patterned.

Figure 3G:
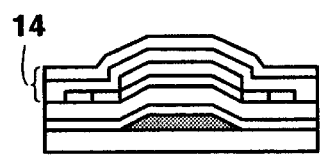
Figure 3G:
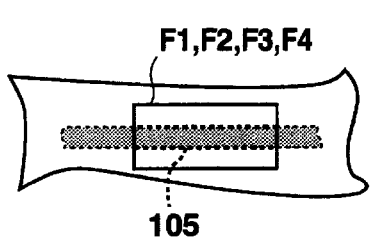

Referring to FIGS. 3G(a) and (b), the interlayer insulating film 14 is then applied. As already described, the interlayer insulating film 14 is composed of sequential lamination of, from bottom, an Si oxidation film, an Si nitride film, and an Si oxidation film.

Figure 3H:
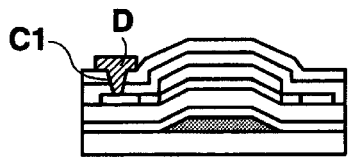
Figure 3H:
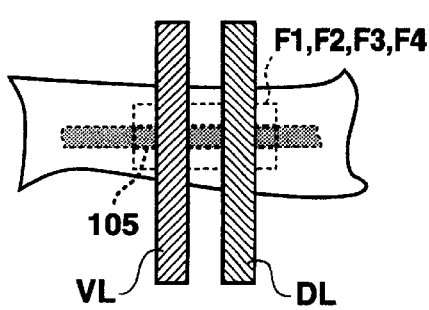

Then, contact holes, corresponding to C1, C2, C4 and C5 of this embodiment, are formed so that the semiconductor layer is exposed, as shown in FIGS. 3H(a) and (b). Referring to FIG. 3H(a), the drain region of the first TFT 1 is connected via the contact hole C1 to the drain electrode which is integrally formed with the data line DL. Further, as shown in FIG. 3H(b), the data line DL and the power source line VL are formed so as to extend across the intersection protective films F1, F2, F3, and F4. The connection line 30 shown in FIG. 2A is also formed simultaneously with the formation of these lines.

Figure 3I:
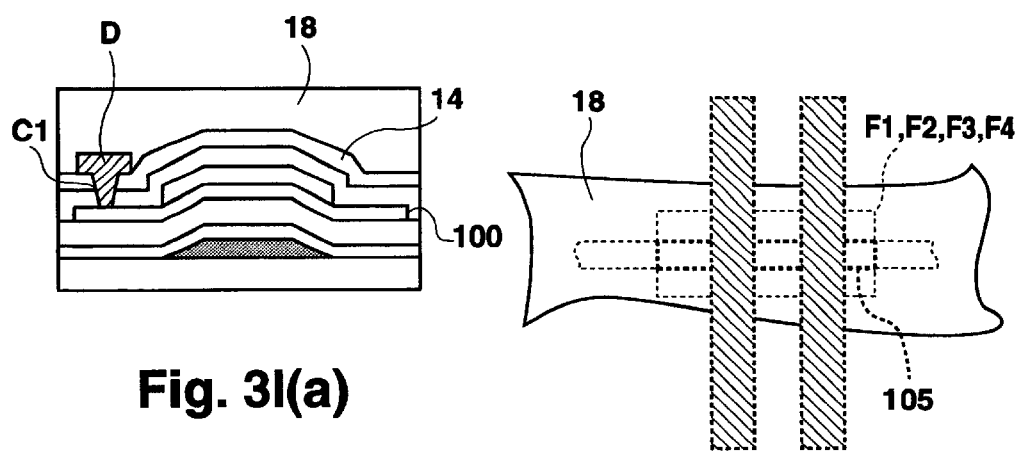

Referring to FIG. 3I(a), the planarizing film 18 is further formed. Then, a contact hole which extends from the planarizing film 18 though the semiconductor layer is provided and a transparent electrode (anode) 6 is formed on the planarinzing film 18. As already described, on this transparent electrode 6, sequential lamination of the first hole transport layer 21, the second hole transport layer 22, the emissive layer 23, and the electron transport layer 24 is formed as emissive element layers, and, finally, the cathode 25 is finally provided on the entire surface.

As is clear from the foregoing description, in each intersection protective film F1, F2, F3 or F4 made of p-Si, the region directly under the stopper insulating film 105, where no ions are doped, is substantially an I (intrinsic) layer having a very high resist. Specifically, since the intersection protective films F1, F2, F3, F4 become an I layer in the regions corresponding to the respective intersections CR1~CR4 and also the stopper insulating film 105 remains on each of the protective films F1~F4, it is possible to enhance the voltage withstanding characteristics while preventing deterioration of the voltage withstanding characteristics and short circuit Further, to further simplify manufacture, the process of forming the stopper insulating films 13, 105 may be eliminated from the above-described flow. When this process is eliminated, application and patterning of the Si oxidation film which constitutes the stopper insulating film can be eliminated. However, since the object of the stopper insulating films 13, 105 is to prevent ions from entering the p-Si film located in the channel of the TFT and the intersections, it is necessary to provide films for preventing ion doping, such as a photoresist, at the corresponding portions when the stopper insulating films 13, 105 are not formed.

Although an organic EL display device has been described in the foregoing embodiment, the present invention is not limited to this example and is applicable to an inorganic EL display device in which an emissive layer EM is composed of an inorganic material, providing similar advantages.

Further, although two TFTs are employed for each pixel in the example used to describe the preferred embodiment, it is also possible to drive the EL element by a single TFT, or each TFT may of a double-gate structure.

The present invention is also applicable to TFTs of a top gate structure. In this case, however, another process is required so as to achieve inter-line insulation at the line intersections.

While the preferred embodiment of the present invention has been described using specific terms, such description is for illustrative purposes only, and it is to be understood that changes and variations may be made without departing from the spirit or scope of the appended claims.

What is claimed is:

1. An EL display device having, for each display pixel, an emissive element and a switching element for driving said emissive element, said device including a first line and a second line intersecting each other, said first and second lines being arranged in a matrix so us to enclose said display pixel and being electrically connected to said switching element,
    wherein a semiconductor film is inserted at an intersection of said first and second lines between these lines, said semiconductor film being insulated from said first and second lines at said intersection, said semiconductor film is formed of poly-silicon, and
    an insulating film is provided above said semiconductor film, said insulating film is inserted at said intersection of said first and second lines.

2. An EL display device having a plurality of display pixels, each display pixel comprising an EL element having an emissive layer between electrodes; a first thin film transistor in which a first conductive region composed of a semiconductor film is connected to a data line and a gate electrode is connected to a gate line; and a second thin film transistor in which a third conductive region composed of said semiconductor film is connected to a power source line for said EL element, a gate electrode is connected to said second conductive region of said first thin film transistor, and a fourth conductive region is connected to said EL element,
    wherein said semiconductor film is inserted at an intersection of said gate line and said power source line between said lines, said semiconductor film being insulated from said gate line and said power source line at said intersection, said semiconductor film is formed of poly-silicon, and
    an insulating film is provided above said semiconductor film, said insulating film is inserted at said intersection of said gate line and said power source line.

3. An EL display device according to claim 2, wherein said power source line and said data line extend so as to be adjacent to each other between said display pixels adjacently disposed and said semiconductor film is provided commonly for a first intersection between the data line and the gate line and for a second intersection between the power source line and the gate line as a common inter-line insulating protective film, said semiconductor film being insulated from said data line and said gate line at said first intersection and from said power source line and said gate line at said second intersection.

4. An EL display device having a plurality of display pixels, each display pixel comprising an EL element comprising:
    an emissive layer between an anode and a cathode;
    a first thin film transistor in which a first conductive region composed of a semiconductor film is connected to a data line and a gate electrode is connected to a gate line which intersects said data line;
    a second thin film transistor in which a third conductive region composed of said semiconductor film is connected to a power source line for said EL element which intersects said gate line, a gate electrode is connected to said second conductive region of said first thin film transistor, and a fourth conductive region is connected to said EL element;
    an upper layer electrode extending from said second conductive region of said first thin film transistor;
    and a storage capacitor line intersecting said power source line and overlapping said upper layer electrode to constitute a storage capacitor, wherein,
        said semiconductor film is inserted at an intersection of said storage capacitor line and said power source line between said lines, said semiconductor film being insulated from said storage capacitor line and said power source line at said intersection, said semiconductor film is formed of poly-silicon, and
        an insulating film is provided above said semiconductor film, said insulating film is inserted at said intersection of said storage capacitor line and said power source line.

5. An EL display device according to claim 4, wherein said power source line and said data line extend so as to be adjacent to each other between said display pixels adjacently disposed and said semiconductor film is provided commonly for a third intersection between the data line and the storage capacitor line and for a fourth intersection between the power source line and the storage capacitor line as a common inter-line insulating protective film, said semiconductor film being insulated from said data line and said storage capacitor line at said third intersection and from said power source line and said storage capacitor line at said fourth intersection.

6. An EL display device according to claim 1, wherein said switching element is formed by a thin film transistor,
said thin film transistor is formed of the same material as used for said semiconductor film;
said semiconductor film of said thin film transistor includes a drain region and a source region each having impurities doped therein, and a channel region having no impurities doped therein and formed between said drain region and said source region; and
a channel stopper is formed of the same material as used for said insulating film, said channel stopper is provided on said channel region.

* * * * *